(12) United States Patent
Shimizu

(10) Patent No.: US 7,058,527 B2
(45) Date of Patent: Jun. 6, 2006

(54) MICROMAGNETIZATION ANALYTICAL PROGRAM AND APPARATUS

(75) Inventor: Koichi Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/790,208

(22) Filed: Mar. 2, 2004

(65) Prior Publication Data

US 2005/0075818 A1    Apr. 7, 2005

(30) Foreign Application Priority Data

Sep. 24, 2003    (JP)    ............................ 2003-332526

(51) Int. Cl.
*G06F 19/00*    (2006.01)
(52) U.S. Cl. ............................ 702/66; 702/57; 702/65; 703/13
(58) Field of Classification Search .................. 702/66, 702/57, 60, 64, 65; 324/200, 205, 244, 600; 703/4, 3, 13, 18
See application file for complete search history.

(56) References Cited

U.S. PATENT DOCUMENTS

| | | | |
|---|---|---|---|
| 5,355,083 A * | 10/1994 | George et al. | .............. 324/229 |
| 5,541,510 A * | 7/1996 | Danielson | .................. 324/233 |
| 6,072,667 A * | 6/2000 | Mizoh et al. | ............... 360/110 |
| 6,219,629 B1 * | 4/2001 | Namiki | ......................... 703/13 |
| 6,700,368 B1 * | 3/2004 | Takano | ........................ 324/210 |
| 6,772,076 B1 * | 8/2004 | Yamamoto et al. | ........... 702/65 |
| 2003/0011361 A1 * | 1/2003 | Takano | ........................ 324/210 |
| 2003/0083832 A1 * | 5/2003 | Takano | ........................ 702/65 |

FOREIGN PATENT DOCUMENTS

JP    10-188042 A    7/1998

OTHER PUBLICATIONS

Bertotti et al., "Perturbation Technique for LLG Dynamics in Uniformly Magnetized Bodies Subject to RF Fields", IEEE, 2002.*
Spinu et al., "Micromagnetic Calculation of the Transverse Susceptibility of Patterned Media", IEEE, 2003.*
Kanai et al., "Simulation of Magnetic Aftereffect in Particulate Recording Media", IEEE, 1991.*

(Continued)

*Primary Examiner*—Patrick J. Assouad
(74) *Attorney, Agent, or Firm*—Armstrong, Kratz, Quintos, Hanson & Brooks, LLP.

(57) ABSTRACT

The precision of a micromagnetization analysis is improved. Parameters of the micromagnetization assigned to the center of a divided microelement and the vector potential assigned to a side or a node of the element are received in procedure 1. A magnetic field equation which supplies an external magnetic field for micromagnetization is generated in procedure 2. A solution of the magnetic field equation is obtained in display 3. A time integral of a LLG equation is obtained using the solution in procedure 4. It is determined in procedure 5 whether or not the micromagnetization obtained in procedure 4 satisfies a convergence condition. When it is not satisfied, a magnetic field equation is corrected and a time is stepwise increased in procedure 6, and the procedures in and after procedure 3 are repeated.

20 Claims, 16 Drawing Sheets

OTHER PUBLICATIONS

Porter, "Analytical Determination of the LLG Zero-Damping Critical Switching Field", IEEE, 1998.*

Suess et al., "Micromagnetic Simulation of Antiferromagnetic/Ferromagnetic Structures", IEEE, 2002.*

Jin et al., "Quasi-Analytical Calculation of Thermal Magnetization Fluctuation Noise in Giant Magnetoresistive Sensors", IEEE, 2004.*

Yamada et al; "GMR Head Simulation System '3D-GMRSIM'"; Fujitsu.51, 5, pp. 291-296 (Sep. 2000) w/full English translation.

Saitoh et al; "The Finite Element Method in Micromagnetics"; Central Research Laboratory, Hitachi Ltd., Kokubunji, Tokyo; vol. 22, No. 12 (1998) pp. 1437-1447 w/full English translation.

* cited by examiner

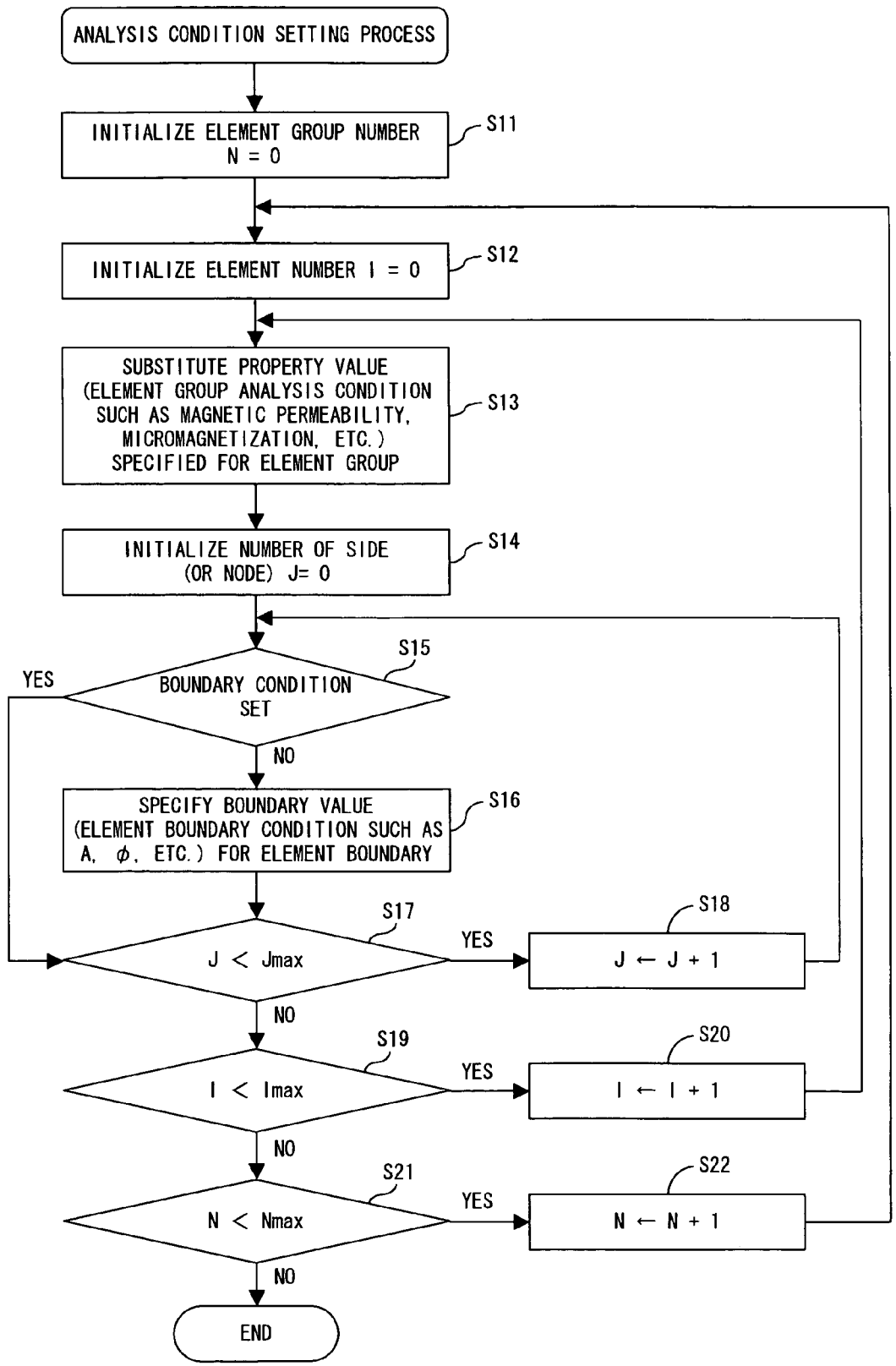
F I G. 9

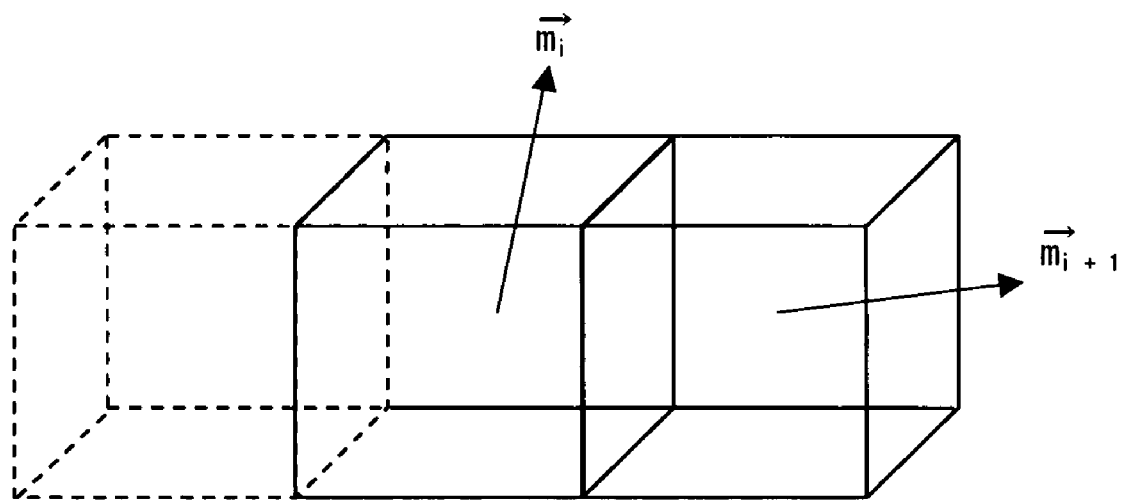
F I G. 1 2

| SETTING GROUP CONDITON (MAICROMAGNETITATION ANAIYSIS) | ☒ |

```
       101           102        MICROMAGNETIZATION VARIABLE
    No = [  2 ]  NAME = [  US  ]    FACILITY                EXCHANGE       ⎫
                                  AXIS MAGNETIC [5.000E+00] COEFFICIENT [10.00E-12]
                                    FIELD (Oe)                 (J/M)              ⎬ 114
                                  MAGNETIZATION            FRICTION              
       MATERIAL SELECION   OPTION  INTENSITY (T) [1.000E+00] COEFFICIENT [1.000E+00] ⎭

┌─────────────┐           FACILITY AXIS DIRECTION ⎫  MAGNETIZATION
         │ NO SETTINGS │                    ┌──────┬─────┐ │   ┌────────┬──────┐
         ├─────────────┤           104      │RANDOM│ARRAY│ │   │FORCIBLE│FORCED│
         │    AIR      │          ┌──────┐106└──────┴─────┘ │   └────────┴──────┘
    103 ─┤             │          │      │   ⦿ 3-DIMENSIONAL│   X COMPONENT [1.000E+00]
         │  CONDUTOR   │          │EXCITING CURRENT         │
         ├─────────────┤    ┌─────┴┬─────┴┐                 │   Y COMPONENT [0.000E+00] ⎬116
         │  MAGNETIC   │    │NONLIN│MAGNET│  ○ ON X-Y PLANE │
         │  SUBSTANCE  │    │EATITY│IZATION│                │   Z COMPONENT [0.000E+00]
         ├─────────────┤    └──────┴──────┘  ○ ON Y-Z PLANE │
         │MICROMAGNE-  │    │QUASISTATIONARY│               │
         │  TIZATION   │    │ MAGNETIZATION │               115
         └─────────────┘  105│   FIXING     │   ○ ON Z-X PLANE  FEATURES OF MAGNETIC FILM ⎫
                            107  108                                                      │
                               / X COMPONENT [1.000E+00]   TYPE [FREE    ▼]               │
    MAGNETIC PERMEABILITY  [1.000E+00]                                                    │
    DIELECTRIC CONSTANT       Y COMPONENT [0.000E+00]    X COMPONENT [0.000E+00] ⎬ 117
         (1/Ωm)            [1.000E+00]-109
                              Z COMPONENT [0.000E+00]    Y COMPONENT [0.000E+00]
    MAGNETIZATION         [0.000E+00]-110
    INTENSITY (T)              RANDOM RATIO [0.000E+00]    Z COMPONENT [0.000E+00] ⎭
    MAGNETIZATION         [0.000E+00]
    X-COMPONENT                    -111
    MAGNETIZATION         [0.000E+00]
    Y-COMPONENT                 BONS DILM                                         ⎫
    MAGNETIZATION         [0.000E+00]  ┌────────────┐ GROUP CONNECTING LAYERS USING
    Z-COMPONENT                        │BOND ELEMENT│ EXCHANGE BOND                ⎬ 118
    ID FOR QUASISTATIONARY             └────────────┘                              
       CALCULATION         [ 0 ◄ ►]       ⦿ Hexc(erg/cm2)  ○ Hin,Hua(Oe) [0.000E+00]⎭
                                   -112
    NUMBER OF DIVISIONS OF [ 0 ◄ ►]
    MAGNETIZATION INTENSITY     -113

[    OK    ]  [ CANNCELED ]
```

FIG. 14

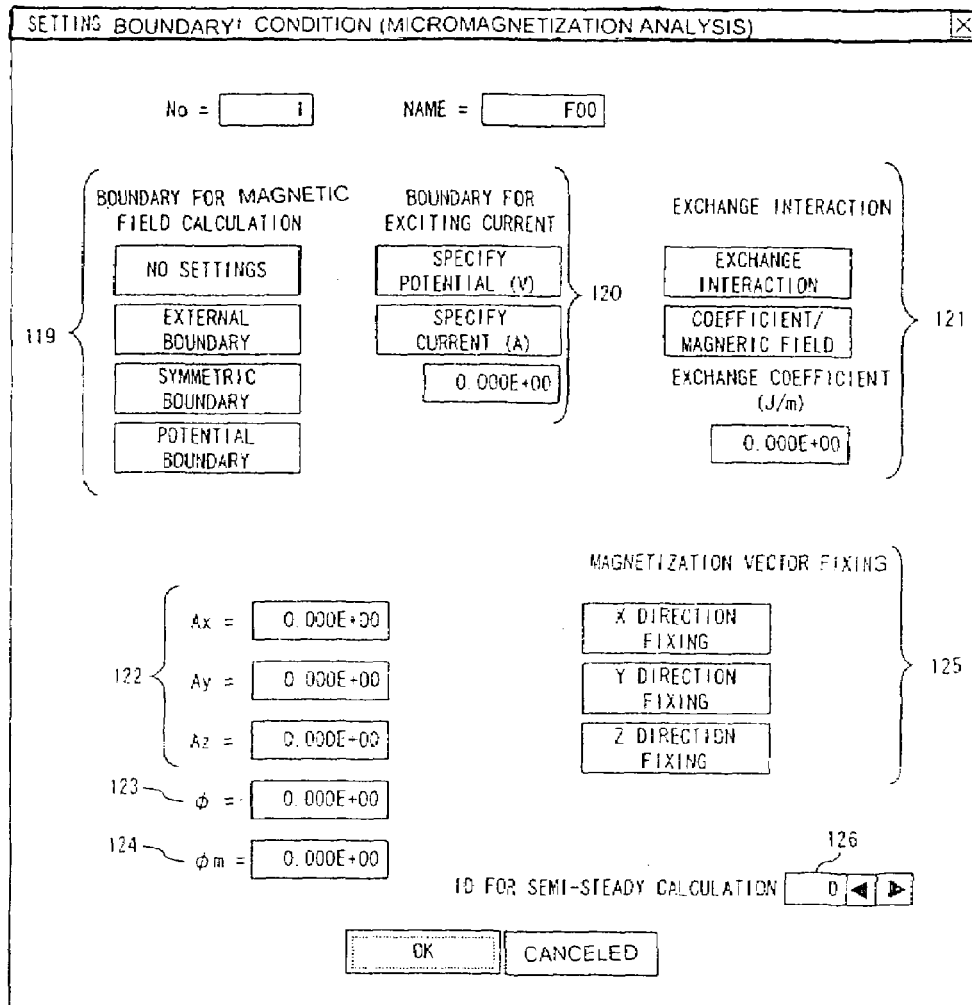
F I G. 1 5

MICROMAGNETIZATION ANALYTICAL PROGRAM AND APPARATUS

BACKGROUND OF THE INVENTION

1. Field of the Invention

The present invention relates to a magnetization analytical system for analyzing a magnetic field around a magnetic substance, and more specifically to a micromagnetization analytical program and an analyzing apparatus for analyzing a magnetic field by dividing a target to be analyzed into microelements in a writing or reading operation using a magnetic head of a hard disk, and assigning micromagnetization corresponding to a micro-magnet to the divided microelements as necessary.

2. Description of the Related Art

Recently, with a giant magneto resistive (GMR) type head, etc. becoming commercially available, the surface recording density of a hard disk, etc. has been amazingly improved. To develop such magnetic heads, for example, a characteristic prediction through simulation, etc. has been demanded.

Generally, in carrying out the magnetic field analysis, an area to be analyzed is divided into microelements with a finite element method, each element is assigned magnetization M in an area having a magnetic substance, vector potential A is assigned to the side or node of an element, and an analysis is conducted with the relationship between magnetization M and a magnetic field H, i.e., a B-H curve or an M-H curve assigned. In the specifications, a vector is represented with an underline given to each symbol.

The conventional technology of the magnetic field analysis is disclosed in the following literatures.

(Literature 1) Saito "Finite Element Method of Micromagnetics: From Formulation to Application" in Bulletin of Japanese Institute of Applied Magnetics Vol. 22, No. 12, p.1437–1447 (1998).

(Literature 2) Yamada, Mukaiyama, Kanai "GMR Head Simulation System: 3D-GMRSIM", FUJITSU, Vol. 51, No. 5, p.291–296 (09. 2000).

Literature 1 is for a user who is to make a magnetic field analysis based on the micromagnetics reviews the concepts of the latest analyses with the finite element method for micromagnetics by four institutes, validating a practical finite element method according to existing examples, and describing related applications.

Literature 2 introduces a regeneration characteristic simulation system of a giant magneto resistive (GMR) type head and describes a magnetic field analysis using a Landau Lifshitz Gilbert (LLG) equation for description of the movement of magnetization, which is applied in the present invention.

However, in the above-mentioned conventional technology, the micromagnetization is assigned to the sides or nodes of an element divided in mesh in order to use the finite element method. Generally, in a magnetization analysis, a parameter of vector potential is assigned to the side or node of an element as described above. Thus, a parameter of a micromagnetization vector has been assigned to the sides or nodes of an element. When the micromagnetization at the center of an element is obtained, a calculation is performed in an interpolation method.

However, a micromagnetization vector m is generally constant in magnitude (i.e. length) precesses rotating around the magnetic field, and stabilizes its direction in a stable state of the entire energy. However, the magnitude or length of a vector, is changed in the interpolation method, thereby failing in obtaining a correct analysis result.

Furthermore, in the conventional method using the B-H curve, etc., a hysteresis analysis cannot be made due to the need of taking into account, and an analysis cannot be made with various magnetic characteristics such as magnetic anisotropy, a crystal boundary, an exchanged magnetic field in an exchange interaction, etc. taken into account.

SUMMARY OF THE INVENTION

The present invention has been made to solve the above-mentioned problems, and aims at providing a micromagnetization analysis system with enhanced analytic precision by assigning a micromagnetization vector to the center of mesh-divided microelement in a micromagnetization analysis, simultaneously solving the LLG equation and a magnetic field equation in each time step, and conducting an analysis considering magnetic characteristics such as magnetic anisotropy, etc. which has not been included in the conventional analyses.

To attain the above-mentioned objective, a computer data signal for performing a micromagnetization analysis embodied in a carrier wave according to the present invention directs a computer to perform the procedures of:

receiving an input of a parameter of a micromagnetization vector assigned to the center of a divided microelement of an area to be analyzed, and a parameter of vector potential assigned to the side or node of an element;

generating a magnetic field equation for providing an external magnetic field for micromagnetization using the input parameters, and initializing a time;

obtaining a solution of the magnetic field equation;

obtaining a time integral of the LLG equation using the solution as an external magnetic field for an unstationary LLG equation;

determining whether or not the micromagnetization obtained by the time integral satisfies a convergence condition;

when the convergence condition is not satisfied, correcting the magnetic field equation using the obtained micromagnetization, and;

repeating a procedure of stepwise increasing the time, the procedure of obtaining a solution of the magnetic field equation and the subsequent procedures.

Furthermore, to attain the above-mentioned objective, a micromagnetization analyzing apparatus according to the present invention includes:

an input unit for receiving an input of a parameter of a micromagnetization vector assigned to the center of a divided microelement of an area to be analyzed, and a parameter of vector potential assigned to the side or node of an element;

a magnetic field equation generating unit for generating a magnetic field equation for providing an external magnetic field for micromagnetization using the input parameters, and initializing a time;

a unit for obtaining a solution of the magnetic field equation;

a unit for obtaining a time integral of the LLG equation using the solution as an external magnetic field for an unstationary LLG equation;

a convergence condition determination unit for determining whether or not the micromagnetization obtained by the time integral satisfies a convergence condition;

a magnetic field equation correction unit for correcting the magnetic field equation using the obtained micromagnetization when the convergence condition is not satisfied, and stepwise increasing the time; and a control unit for repeating operations of the unit for obtaining a solution and the subsequently stated units by using the corrected magnetic field equation.

BRIEF DESCRIPTION OF THE DRAWINGS

FIG. 9 is a detailed flowchart of the analysis condition setting process;

FIG. 12 is an explanatory view of assigning micromagnetizations in a finite volume method;

FIG. 14 shows a dialog for setting an element group analysis condition;

FIG. 15 shows a dialog for setting an element boundary analysis condition; and

DESCRIPTION OF THE PREFERRED EMBODIMENTS

Figure 1:
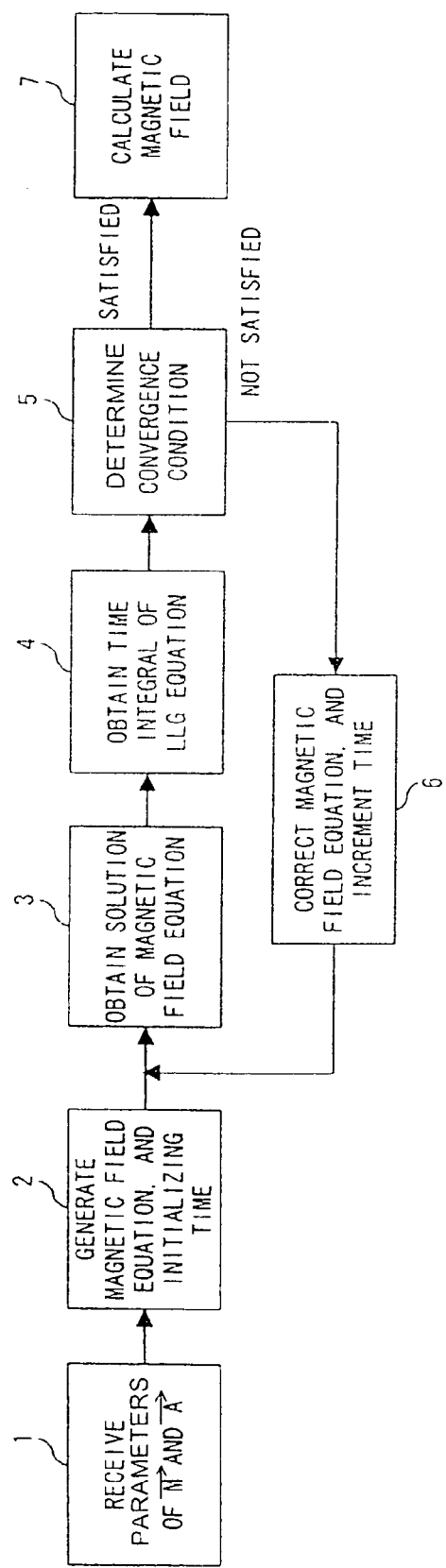
FIG. 1 is a functional block diagram of the function showing the principle of a micromagnetization analytical program according to the present invention.

FIG. 1 is a functional block diagram showing the principle of the micromagnetization analytical program according to the present invention. That is, FIG. 1 is a functional block diagram showing the principle of a micromagnetization analytical program in which a solution of a magnetic field equation is obtained in each time step using a finite volume method in which a micromagnetization vector is assigned to the center of a microelement divided in mesh form; a time integral of the LLG equation is found using the obtained solution as an external magnetic field for the LLG equation; these procedures are repeated until the obtained micromagnetization satisfies the convergence condition.

In FIG. 1, first in procedure 1, a parameter of the micromagnetization vector assigned to the center of a divided microelement of an area to be analyzed, and a parameter of vector potential assigned to the side or node of the microelement are input. Then, in procedure 2, using the input parameters, a magnetic field equation for providing an external magnetic field for micromagnetization is generated, and the time is initialized to 0. In procedure 3, a solution of the magnetic field equation is obtained. In procedure 4, the time integral of the LLG equation is obtained using the solution as an external magnetic field for an unstationary LLG equation. In procedure 5, it is determined whether or not the micromagnetization obtained with the time integral satisfies a convergence condition. If the convergence condition is not satisfied, then the magnetic field equation is corrected using the obtained micromagnetization, and the time is stepwise increased in procedure 6. Then, control is returned to procedure 3, and the procedures are repeated from the procedure of obtaining a solution of the magnetic field equation. If the convergence condition is satisfied in procedure 5 shown in FIG. 1, then the procedure of obtaining a magnetic field by micromagnetization is performed in procedure 7 using the micromagnetization obtained by the time integral of the LLG equation.

In the present invention, the magnetic field equation generated in procedure 2 shown in FIG. 1 is a stationary magnetic field equation using vector potential or an unstationary magnetic field equation.

In an embodiment of the present invention, in procedure 4 of obtaining a time integral of the LLG equation shown in FIG. 1, a product of the difference between the micromagnetization vector assigned to a current element and the micromagnetization vector assigned to the adjacent element and an exchange interaction coefficient can be set as an exchanged magnetic field by an exchange interaction with the adjacent element. In this case, if the exchange interaction coefficient for the adjacent element is different from the coefficient for the current element, then an average value can be used as an exchange interaction coefficient.

In procedure 4 of obtaining a time integral of the LLG equation, as an exchanged magnetic field for elements contacting the boundary of the element group formed by a plurality of elements, there may be set a product of an externally specified one of an exchange interaction coefficient assigned to the boundary and an exchange interaction coefficient assigned to the element group, and the difference between the micromagnetization vector assigned to the current element and the micromagnetization vector assigned to the adjacent element.

Furthermore, in procedure 4 of obtaining a time integral of the LLG equation, for the elements contacting the boundary of the element group formed by a plurality of elements, a value of an exchanged magnetic field can be set using either an externally received input value of an exchanged magnetic field assigned to the boundary, or an input value of an exchange interaction coefficient which depends on the size of an element and which is multiplied by the different between the micromagnetization vector assigned to the current element and the micromagnetization vector assigned to the adjacent element to obtain the exchanged magnetic field.

A micromagnetization analyzing apparatus according to the present invention divides an area to be analyzed into microelements in a mesh form, assigns a parameter of a micromagnetization vector to the center of an element, and simultaneously uses a magnetic field equation and an LLG equation, thereby performing a micromagnetization analysis.

The micromagnetization analyzing apparatus according to the present invention comprises: a parameter input unit for receiving inputs of a parameter of a micromagnetization vector assigned to a microelement, and a parameter of vector potential assigned to the side or node of an element; a magnetic field equation generating unit for generating a magnetic field equation for providing an external magnetic field for micromagnetization using the input parameters and initializing a time; a unit for obtaining a solution of the magnetic field equation; a unit for obtaining a time integral of an LLG equation; a convergence condition determination unit for determining whether or not the micromagnetization obtained by the time integral satisfies a convergence condition; a magnetic field equation correction unit for correcting the magnetic field equation using the obtained micromagnetization when the convergence condition is not satisfied, and stepwise increasing the time; and a control unit for repeating the operations of the unit for obtaining a solution of the magnetic field equation and the following units by using the corrected magnetic field equation.

The micromagnetization analyzing apparatus according to the present invention further comprises a magnetic field calculation unit for obtaining a magnetic field by micromagnetization using micromagnetization obtained by the time integral of the LLG equation when the convergence condition determination unit determines that the convergence condition has been satisfied.

As described above, according to the present invention, the parameter of a micromagnetization vector is assigned to the center of an element divided in a mesh form, thereby performing a magnetization analysis.

Figure 2:
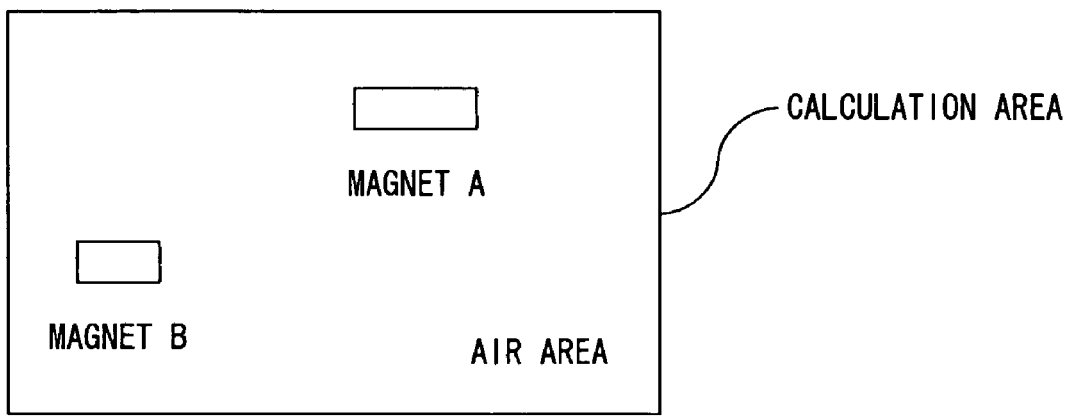
FIG. 2 is an explanatory view of the calculation area of the micromagnetization analysis according to an embodiment of the present invention.

Embodiments of the present invention are described below by referring to FIG. 2 and the subsequent drawings. FIG. 2 is an explanatory view of the concept of the calculation area for the micromagnetization analysis according to the present invention. In FIG. 2, two magnets A and B and an air area are contained in the calculation area.

The calculation area is divided into microelements in mesh form, and, for example, a property value depending on the material is defined for each element. However, since the operation of defining the property of the material for each microelement divided in mesh form is a tremendous job, elements belonging to the same material are grouped in advance, and a analysis condition is set for each group. Thus, as shown in FIG. 2, an element group for the magnet A, an element group for the magnet B, and an element group for the air area form a calculation area.

Figure 3:
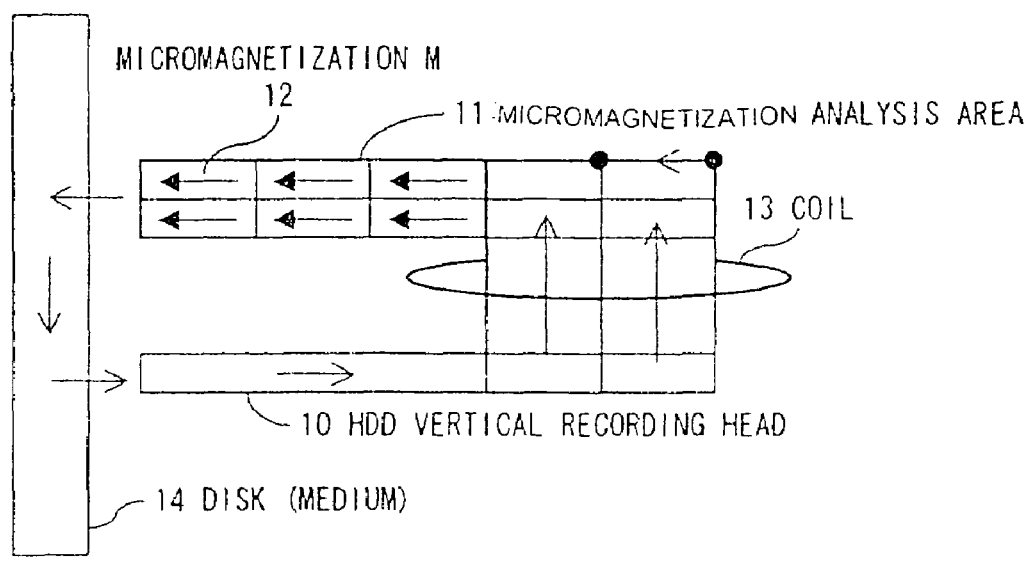
FIG. 3 is an explanatory view of an analyzing method for an HDD vertical recording head.

FIG. 3 is an explanatory view of the magnetic field analysis for the hard disk drive (HDD) vertical recording head as a specific target of a micromagnetization analysis. In FIG. 3, an HDD vertical recording head 10 is divided into microelements in mesh form, and the element at the tip of the write head is divided into furthermore smaller microelements, for example, in the order of several tens or several hundreds in nm, thereby forming a micromagnetization analysis area 11 (bold portion).

Micromagnetization m 12 is assigned to each element in the micromagnetization analysis area 11, i.e., for example, to each of several thousands of elements. It is the feature of the present embodiment that a micromagnetization m 12 is assigned to the center of each element. By supplying currents to a coil 13, data is written to a disk (medium) 14. In this data write for example, a magnetic field analysis is carried out.

In the vertical recording head 10, the portion other than the portions of the micromagnetization analysis area 11 to which the micromagnetization m 12 is assigned is considered to be free from magnetic saturation, not assigned the micromagnetization m, and subjected to a linear analysis. The micromagnetization m can be thought to be correspondent to a micromagnet. This concept of the micromagnetization can be basically applied to the general magnetization vector M including the concept of the magnetic moment.

Figure 4:
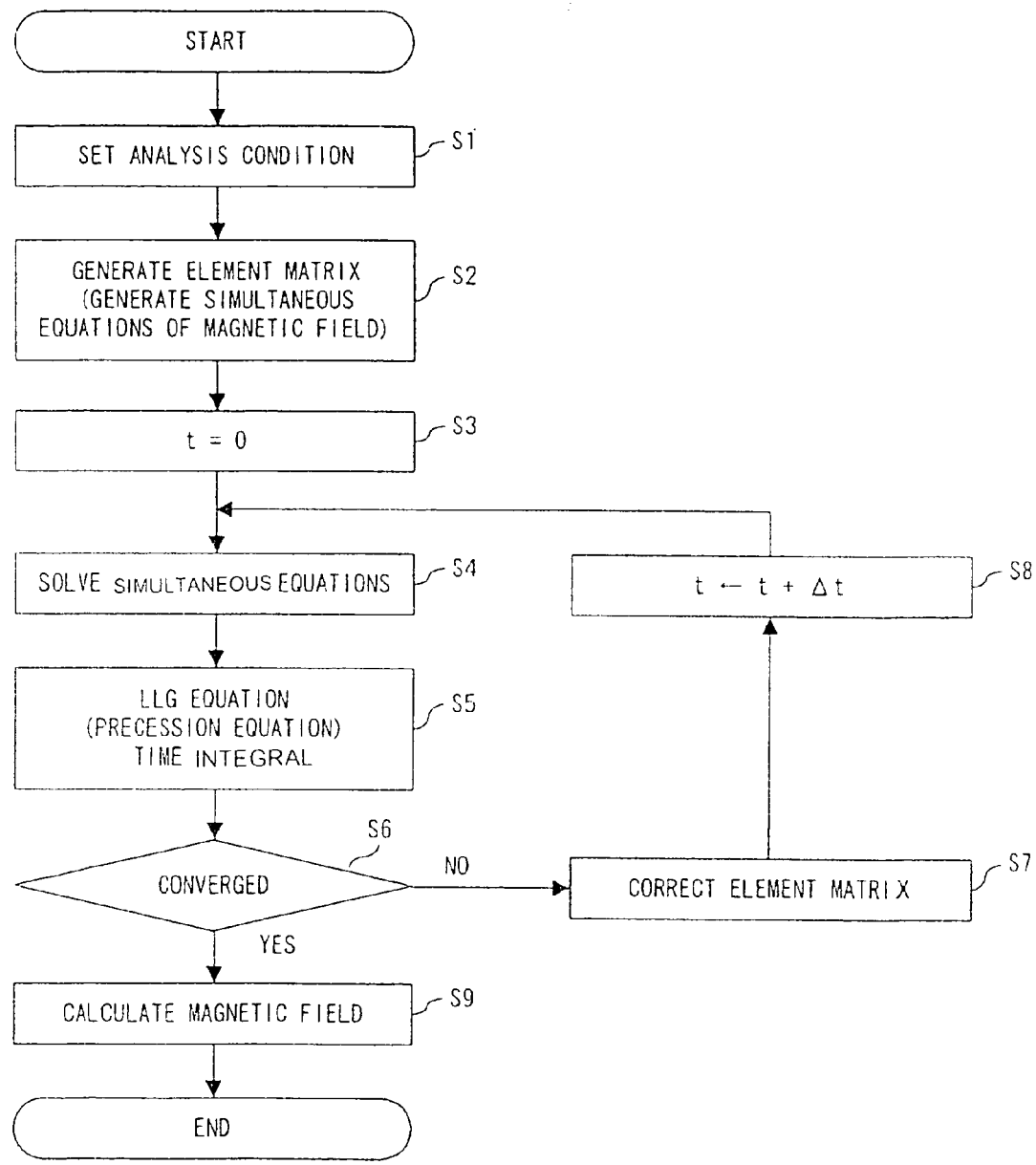
FIG. 4 is a flowchart of the basic process of the micromagnetization analysis according to the embodiment of the present invention.

FIG. 4 is a flowchart of the entire process of the magnetization analysis according to the present embodiment. In the present embodiment, simultaneous equations of a stationary or unstationary magnetic field are solved to obtain an external magnetic field for an unstationary LLG (Landau Lifshitz Gilbert) equation describing the movement of the micromagnetization, and the movement of the micromagnetization m is analyzed with the time integral of the LLG equation using the obtained external magnetic field. By the time integral of the LLG equation, the movement of each micromagnetization m can be obtained as the functions of a time and coordinates.

When the process shown in FIG. 4 is started, the analysis conditions for the element group and the element boundary are fist set in step S1. As described above, since the process of setting an analysis condition to each microelement is a tremendous job, analysis conditions are set collectively for elements belonging to each element group, and an analysis condition is set for the boundary of an element group. The setting process is described later.

In step S2, an element matrix in a stationary magnetic field equation or an unstationary magnetic field equation as simultaneous equations of a magnetic field is generated, and the simultaneous equations are generated for a magnetic field calculation.

The stationary magnetic field equation generated in this step is an equation using vector potential A, and can be presented, assuming the current density of the current flowing through the coil 13 shown in FIG. 3 to be Jo in the present embodiment, as follows;

$$\vec{\nabla} \times (v\vec{\nabla} \times \vec{A}) = \vec{Jo} + v_o \vec{\nabla} \times \vec{m} \tag{1}$$

where v indicates a reciprocal of the magnetic permeability $\mu$ ($v_0 = 1/\mu_0$).

An unstationary magnetic field equation is represented using vector potential A and scalar potential $\phi$, and is expressed as follows. The scalar potential $\phi$ does not indicate a physical amount, but something like a integral constant. "$\sigma$" indicates the conductivity.

$$\vec{\nabla} \times (v\vec{\nabla} \times \vec{A}) = \vec{Jo} - \sigma\left(\frac{\partial \vec{A}}{\partial t} + \vec{\nabla}\phi\right) + v_o \vec{\nabla} \times \vec{m} \tag{2}$$

$$\vec{\nabla} \cdot \left\{-\sigma\left(\frac{\partial \vec{A}}{\partial t} + \vec{\nabla}\phi\right)\right\} = 0 \tag{3}$$

A stationary magnetic field equation is used in a magnetic field analysis when a stationary current or a current which slowly changes over time flows through a coil, and a magnetic field calculation is carried out without considering the eddy currents by the change of the magnetic field over time.

Specifically, it is used in a magnetic field analysis around the read head in a reading operation on a hard disk, i.e., in a magnetic field analysis performed when a constant sense current is supplied to the read unit so that the magnetic field from the disk can be detected by the change of the sense current.

The unstationary magnetic field equation is used in a magnetic field calculation when the change of a current over time is large. Specifically, as described above by referring to FIG. 3, it is used when a current is supplied to the coil 13, and a write magnetic field is analyzed in a data write.

When the simultaneous equations of the magnetic field are generated in step S2 shown in FIG. 4, the analysis time t is initialized to 0 in step S3. In step S4, the simultaneous equations of the magnetic field are solved. In step S5, the time integral of the LLG equation is obtained using the calculated magnetic field as an external magnetic field for the micromagnetization in the LLG equation (precession equation). In step S6, it is determined whether or not the convergence conditions have been satisfied. As the time range of the time integral, the time step width $\Delta t$ described later is used in step SB.

The precession equation (LLG equation) describing the movement of the micromagnetization m is expressed as follows.

$$\frac{\partial \vec{m}}{\partial t} = -\gamma \vec{m} \times \vec{H}_{eff} + \alpha \left( \vec{m} \times \frac{\partial \vec{m}}{\partial t} \right) \quad (4)$$

$$\vec{H}_{eff} = \vec{H}_{ex} + \vec{H}_{k} + \vec{H}_{ext} \quad (5)$$

where $\gamma$ indicates a friction coefficient, and $\alpha$ is a constant depending on the angular frequency. $H_{eff}$ indicates an effective magnetic field. $H_{ex}$ indicates an exchanged magnetic field mainly due to the exchange interaction from the micromagnetization vector of the adjacent element. $H_k$ indicates an anisotropic magnetic field. $H_{ext}$ indicates an external magnetic field (including an inverse magnetic field).

The anisotropic magnetic field $H_k$ corresponds to the angle with the easily magnetized axis (in the voluntary micromagnetization direction) of a magnetic substance. The exchanged magnetic field $H_{ex}$ is described later.

Figure 5:
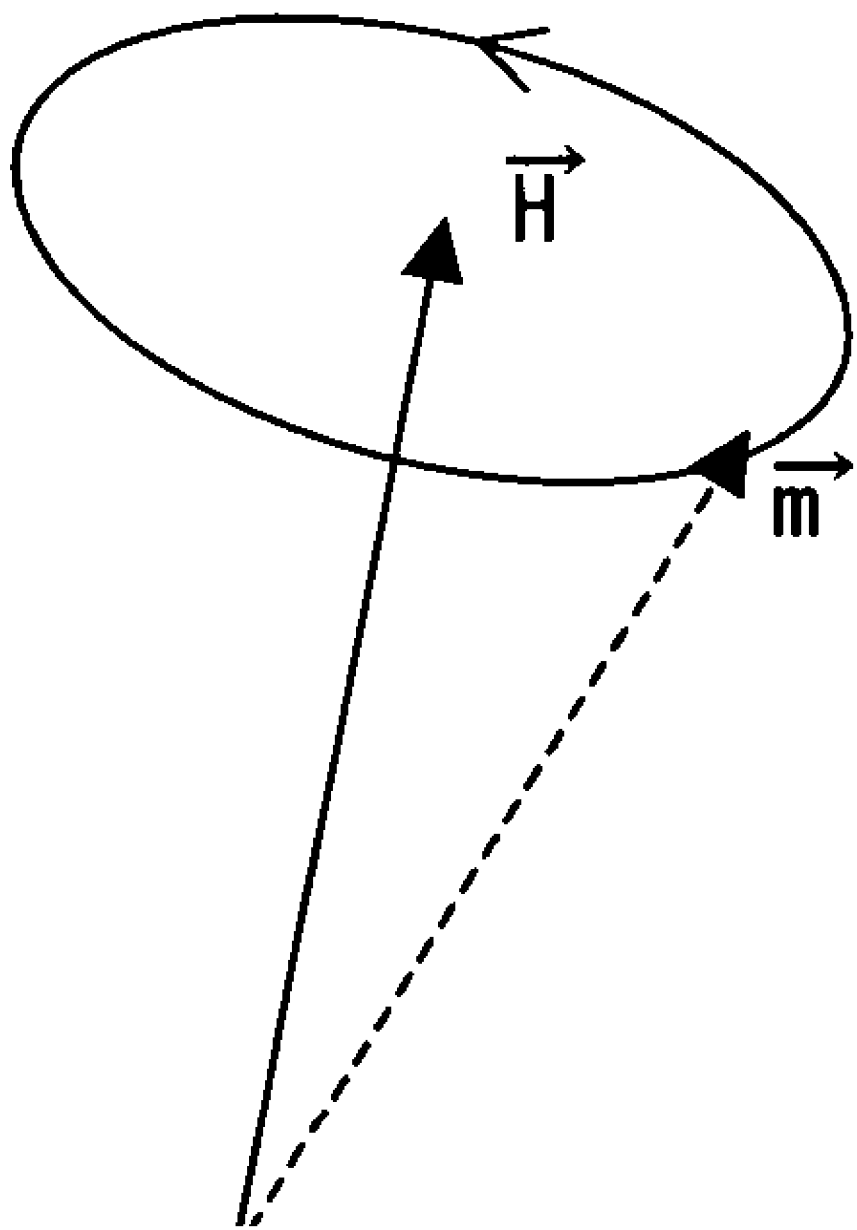
FIG. 5 is an explanatory view of the precession of micromagnetization.

FIG. 5 is an explanatory view of the precession of a micromagnetization. The micromagnetization m converges into a stable state of energy on the whole precessing around the magnetic field H, for example, the effective magnetic field described later under the effect of the magnetic field by the exchange interaction under an external magnetic field and other micromagnetization. That is, in step S6 shown in FIG. 4, the determination of the convergence condition is made by determining the following condition that the level of the rate of change of m with respect to time is smaller than a threshold.

$$\left| \frac{\partial \vec{m}}{\partial t} \right| \leq \left| \frac{\partial \vec{m}}{\partial t} \right|_{th} \quad (6)$$

When it is determined that the convergence condition is not satisfied, the element matrix is corrected in the magnetic field equation in step S7.

For example, the above-mentioned stationary magnetic field equation can be expressed by the following matrix equation.

$$[\text{matrix } C] \begin{bmatrix} \vec{A}_1 \\ \vdots \\ \vec{A}_n \end{bmatrix} = \begin{bmatrix} \text{term of} \\ \text{current} \end{bmatrix} + \begin{bmatrix} \text{term of} \\ \text{micromagne} \\ \text{-tization } m \end{bmatrix} \quad (7)$$

The matrix C is an element matrix. When both sides are multiplied by the inverse matrix of the matrix C from the left, n vector potential $A_1 \sim A_n$ are obtained for the external magnetic field. "n" indicates the number of sides when the vector potential is assigned to the side of the element divided in mesh form, and indicates the number of nodes when it is assigned to the node.

When the micromagnetization m is obtained in step S5, the term relating to the micromagnetization m on the right side of the magnetic field equation of the matrix is corrected, thereby successfully correcting the element matrix in the simultaneous equations for obtaining the vector potential A.

In FIG. 4, the value of the analysis time t is incremented by $\Delta t$ in step S8, the processes in and after step S4 is repeated. When it is determined that the convergence condition is satisfied in step S6, the magnetic field is calculated in step S9, thereby terminating the process. In step S9, the magnetic field is calculated on the micromagnetization m by the following equation (8).

$$\vec{H} = \frac{1}{\mu_0} (\vec{\nabla} \times \vec{A} - \vec{m}) \quad (8)$$

It is also possible to set the maximum time T max for the analysis in advance instead of the determination of the convergence condition in step S6, and to perform the process in step S9 if the time has passed.

Figure 6:
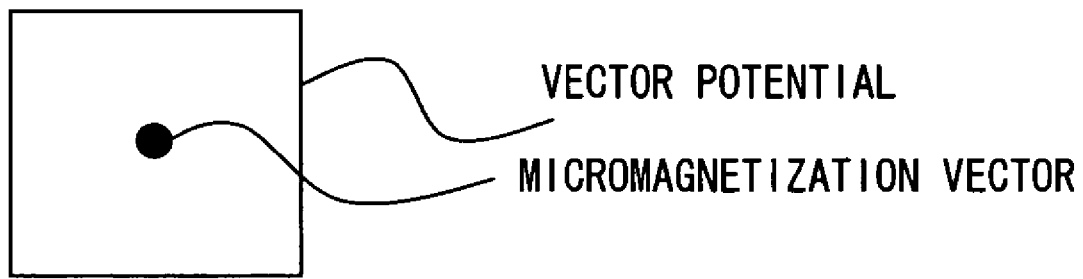
FIG. 6 is an explanatory view (1) of assigning a parameter to an element according to the embodiment of the present invention.
Figure 7:
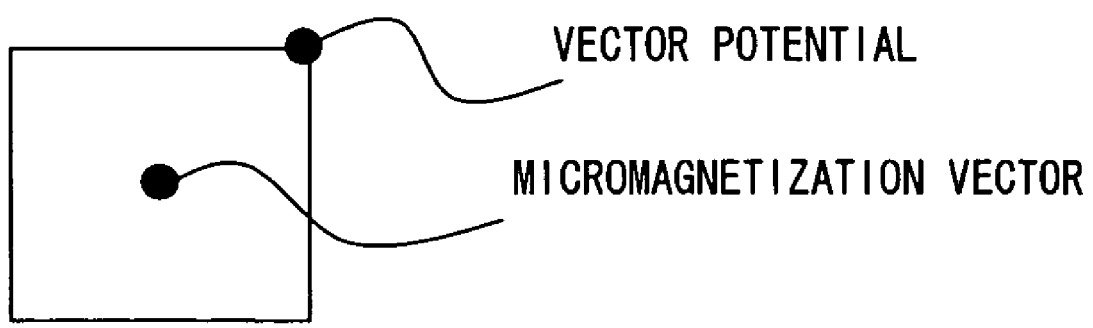
FIG. 7 is an explanatory view (2) of assigning a parameter to an element according to the embodiment of the present invention.

Described below is setting the analysis condition on the element group and the element boundary in step S1 shown in FIG. 4. FIGS. 6 and 7 are explanatory views of assigning a magnetization vector parameter of micromagnetization for a microelement divided in mesh form and a parameter of vector potential as the process specific to the present embodiment in setting an analysis condition.

In the present embodiment, instead of assigning the magnetization vector m of the micromagnetization to the node or the side of an element and performing interpolations for the inner part of an element using a function, as done in the common finite element method, a parameter of the magnetization vector m of the micromagnetization is arranged at the center of an element such that the finite volume method in which it can be defined as a value in the entire element is used. Therefore, the analysis can be made without using an interpolation function for obtaining a value within the element.

In FIG. 6, the parameter of the vector potential, for example, the x, y, and z components thereof are assigned to a side of an element, and the parameter of the micromagnetization vector is assigned to the center of the element.

In FIG. 7, a parameter of the vector potential is assigned to a node of an element, and a parameter of the micromagnetization vector is assigned to the center of an element.

Generally, in a magnetic field analysis, when the vector potential A is arranged at the node or the side of an element, the magnetic flux density B obtained as the rotation of A is arranged at the center of the element. Therefore, based on the common relation between the magnetization M and B, the magnetization M is also arranged at the center of the element.

According to the above-mentioned concept, it is reasonable that the micromagnetization m is arranged at the center of the element as in case of the magnetization M also in the micromagnetization analysis. Thus, in the present embodiment, the micromagnetization m is arranged at the center, and the magnetic field equation, i.e., simultaneous equations are solved to determine the vector potential A so that a magnetic field analysis can be conducted.

Figure 8:
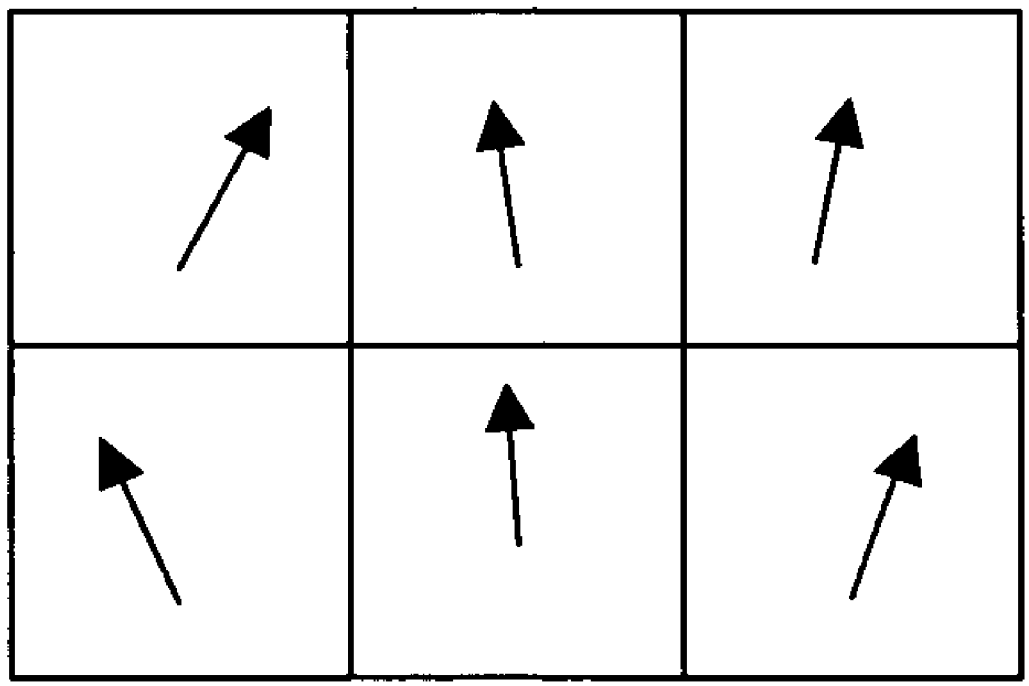
FIG. 8 is an explanatory view of a magnetic field from a micromagnetization area.

FIG. 8 is an explanatory view of the magnetic field from the micromagnetization area. By arranging the micromagnetization vector at the center of an element, the magnetic field from the micromagnetization area is obtained as overlapping magnetic fields from respective micromagnetizations in a convergence state in which the entire energy is stable.

FIG. 9 is a detailed flowchart of the process of setting a analysis condition in step S1 shown in FIG. 4. In the present embodiment, elements of the same material are grouped as an element group to set the analysis conditions to the element group and the element boundary, for example, the boundary of the element group. In FIG. 9, for example, the values of the analysis conditions input from a user is received by a dialog described later.

When the process is started as shown in FIG. 9, the element group number N is initialized in step S11. In step S12, the element number I is initialized to 0. In step S13, as the element analysis condition, entered and received are the property values such as the magnetic permeability, the micromagnetization, etc. specified for each element group, i.e., the element group having the group number N of 0 in this example. In the present embodiment, since the property value is specified for an element group, the process can be performed before step S12.

Then, in step S14, the number J of a side or a node is initialized, and it is determined in step S15 whether or not there is a boundary condition. If there is a boundary condition, it means there is no necessity to specify an analysis condition for a boundary as in the case in which the value of the vector potential A is preset to 0 at the outermost boundary of the calculation area as described above by referring to FIG. 2.

When there is no boundary condition, the value of the vector potential A or the scalar potential $\phi$ is specified in step S16, and it is determined in step S17 whether or not the number J of the side or the node is smaller than the maximum value J max. If it is smaller than the maximum value, then the value of J is incremented in step S18, and the processes in and after step S15 are repeated. If it is determined in step S15 that there is a boundary condition, then the control is immediately passed to step S17.

If it is determined in step S17 that the number J of a side or a node has reached the maximum value J max, then it is determined in step S19 whether or not the element number I is smaller than the maximum value I max. If it is smaller than the maximum value, then the value of I is incremented in step S20, and the processes in and after step S13 are repeated.

If it is determined in step S19 that the value of the element number I has reached the maximum value, then it is determined in step S21 whether or not the element group number N is smaller than the maximum value N max. If it is determined that it is smaller than the maximum value, then the value of N is incremented in step S22, and the processes in and after step S12 are repeated. When it is determined in step S21 that the element group number N has reached the maximum value, the process terminates.

The analysis condition described above by referring to FIG. 9 is set through dialogs shown in FIGS. 14 and 15. In the condition setting dialog for an element group, the characteristics of an element group are selected and practical property values are set as the conditions of generating simultaneous equations expressed by the equation (7) above. Also in the condition setting dialog for an element boundary, for example, the value of the vector potential A at a boundary, etc. is specified in the same manner as the temperature at a boundary is set in a problem of the thermal conductivity. It is obvious that the condition for a boundary can be set before setting the condition for an element group.

Figure 10:
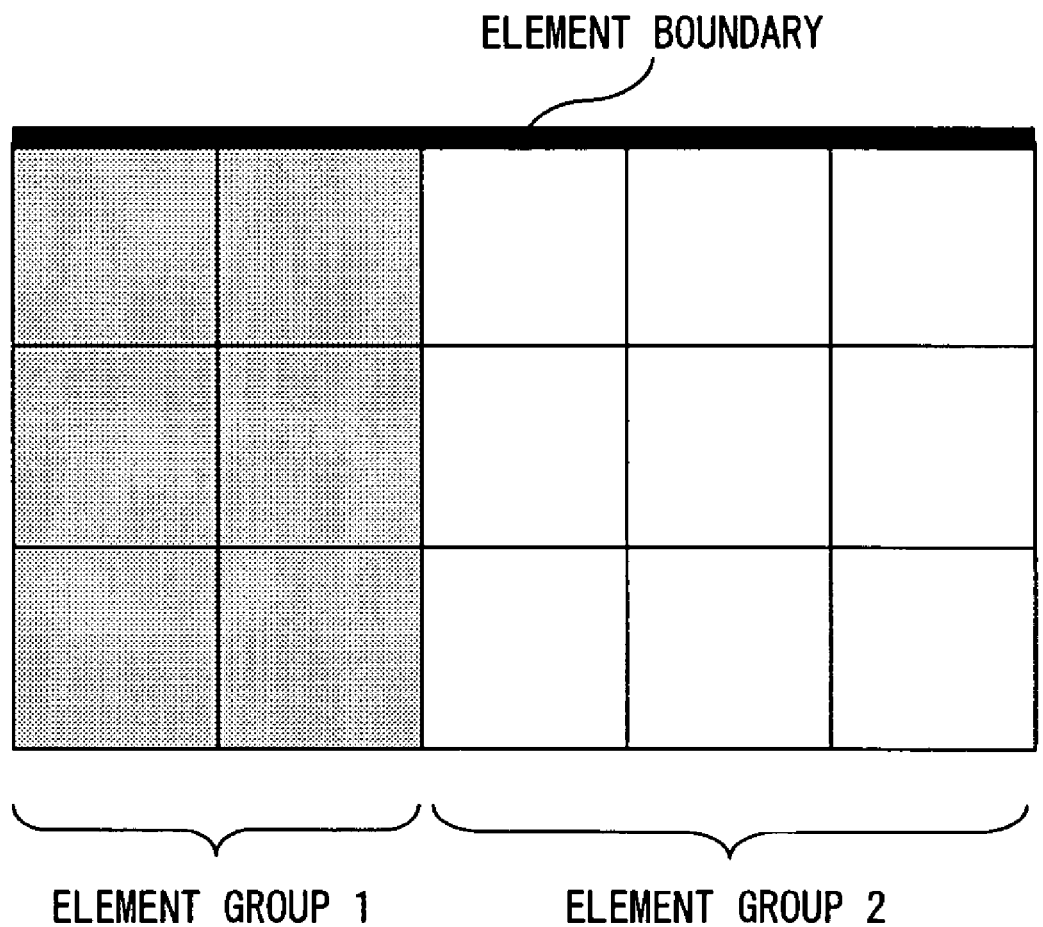
FIG. 10 is an explanatory view of an element boundary.

The term "element boundary" is described below by referring to FIG. 10. The term "element boundary" means the boundary between an element and its adjacent element. However, in the present embodiment, it also refers to the boundary of an element group. As shown in FIG. 10, a common element boundary shared by two element groups can also be defined.

Figure 11:
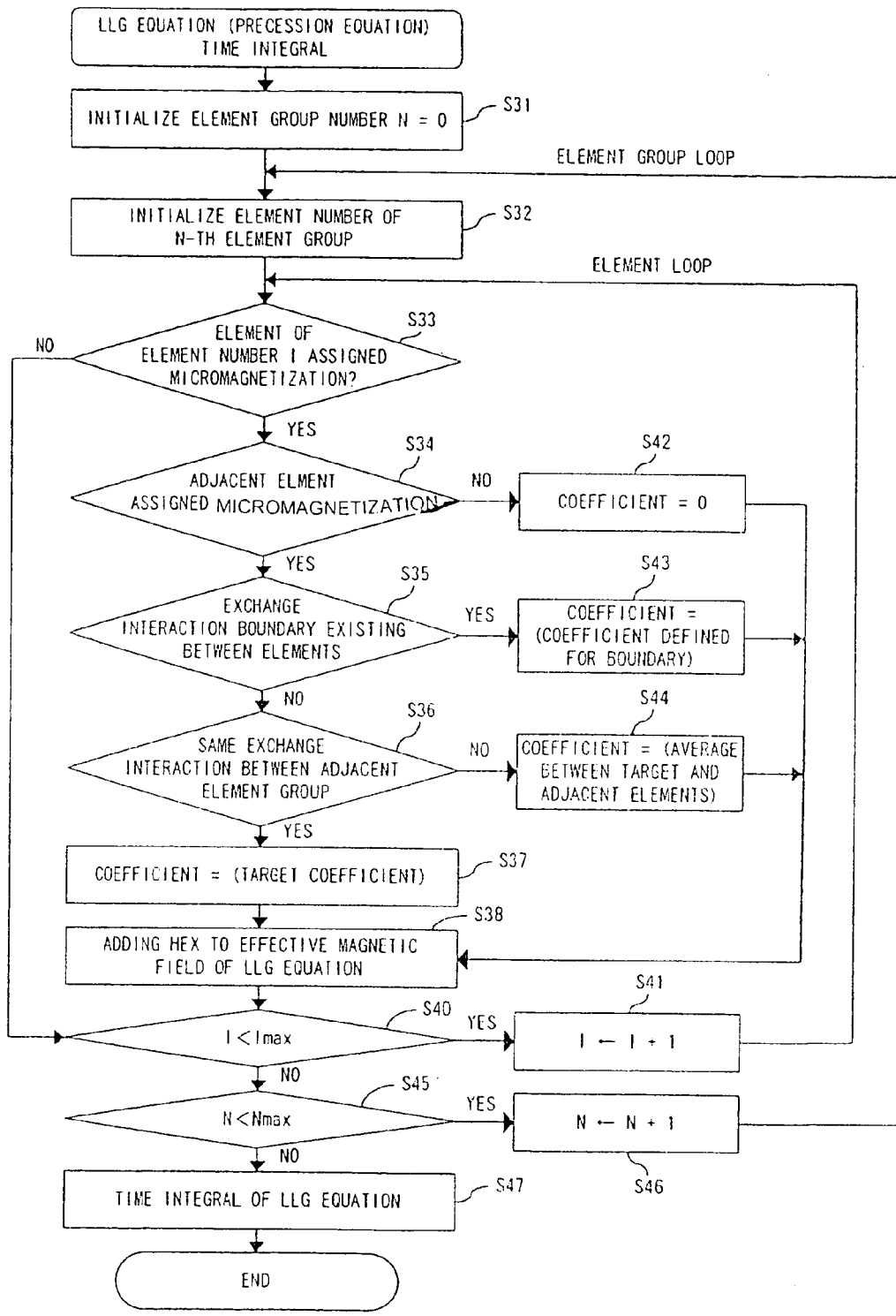
FIG. 11 is a detailed flowchart of the LLG equation time integral process.

According to the present embodiment, a magnetization analysis can be performed with various magnetic characteristics such as the exchange interaction, the crystal boundary, the inverse magnetic bond, etc. which cannot be represented only using the conventional B-H curve or M-H curve taken into account. FIG. 11 shows the consideration of the various magnetic characteristics.

FIG. 11 is a detailed flowchart of the process of the time integral of an LLG equation in step S5 shown in FIG. 4. This process relates to the time integral for each range of a time step Δt explained by referring to FIG. 4 using the precession equation describing the movement of the micromagnetization, i.e., the Landau Lifshitz Gilbert (LLG) equation. In this example, the value of the exchanged magnetic field $H_{ex}$ by the exchange interaction received from each element or the adjacent element for each element group is obtained before actually obtaining the time integral of the LLG equation; the obtained value is processed to use it as term of the effective magnetic field of the LLG equation; and thereafter the time integral is carried out.

In FIG. 11, the group number N of the element group is initialized to 0 first in step S31. In step S32, the element number I in the N-th element group is initialized to 0. In step S33, it is determined whether or not the element of the element number I is micromagnetization, i.e., the micromagnetization m is assigned to the center of the element. If it is assigned, it is determined in step S34 whether or not the adjacent element is the micromagnetization. If the micromagnetization is assigned, the process of obtaining the exchanged magnetic field $H_{ex}$ by the exchange interaction is performed in and after step S35.

In step S35, it is determined whether or not there is a boundary of an exchange interaction between the target element having the number I and the adjacent element. For example, when a simulation is performed using a crystal boundary between two elements, an exchange interaction boundary for the crystal boundary is set. If there is no such boundary, then it is determined in step S36 whether or not the exchange interaction coefficients set for the element groups for simplicity of process are the same. That is, assuming that the element having the number I and the adjacent element belong to different element groups, it is determined whether or not the coefficients of the exchange interaction of the element groups match each other. If the element I and the adjacent element belong to an identical element group, the determination result is obviously YES.

If the values of the coefficients match each other between the adjacent element groups, then the coefficient of the interaction of the element of the number I is recognized as the coefficient of the exchange interaction from the adjacent element in step S37, and the exchanged magnetic field $H_{ex}$ in the effective magnetic field $H_{eff}$ of the LLG equation is added in step S38.

The exchanged magnetic field by the exchange interaction is described below by referring to FIGS. 12 and 13. FIG. 12 shows the magnetization vector $m_i$ assign to the i-th element in the finite volume method, and the magnetization vector $m_i+1$ assigned to the (i+1)th element, i.e., the adjacent element. Each of the vectors is assigned to the center of the element as shown by the starting point of the magnetization vector which part is placed at the center of each element.

The exchanged magnetic field by the exchange interaction from the adjacent element is obtained by multiplying the difference between the magnetization vector $m_i+1$ assigned to the adjacent element and the magnetization vector $m_i$ assigned to the target element by the coefficient of the exchange interaction from the adjacent element.

Figure 13:
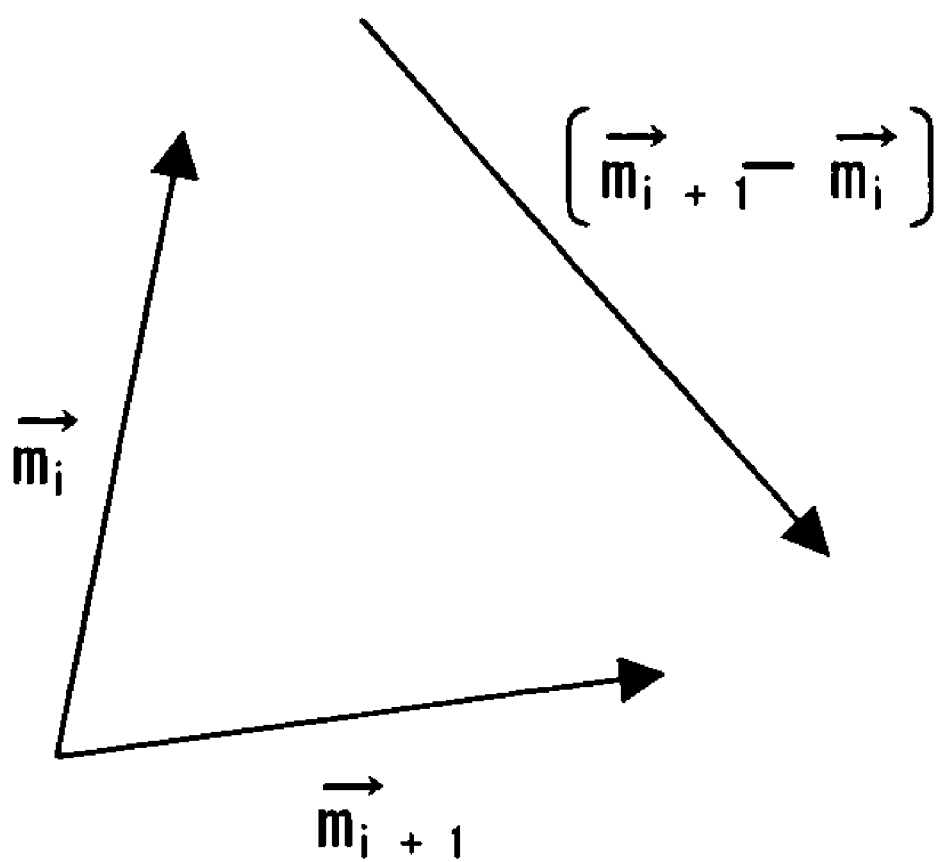
FIG. 13 is an explanatory view of the difference in the micromagnetization vector shown in FIG. 12.

FIG. 13 is an explanatory view showing the difference between the magnetization vectors. FIG. 13 shows the difference between the magnetization vector assigned to the (i+1)th element and the magnetization vector assigned to the i-th element. The exchanged magnetic field $H_{ex}$ is obtained by multiplying the difference between the magnetization vectors by the coefficient of the exchange interaction from the adjacent element obtained in step S37 shown in FIG. 11, and the exchanged magnetic field $H_{ex}$ is used as the exchanged magnetic field in the effective magnetic field of the LLG equation in step S38.

If it is determined in step S33 shown in FIG. 11 that the micromagnetization is not assigned to the element having the element number i, it is determined in step S40 whether or not the element number I in the group is smaller than the maximum value I max. If it is smaller than the maximum value, then the value of I is incremented in step S41, and the processes in and after step S33 are repeated.

If it is determined in step S34 that the micromagnetization is not assign to the adjacent element, then the exchange interaction is not received from the adjacent element. Therefore, the coefficient of the interaction is set to 0 in step S42, and the control is passed to step S38 in which the exchanged magnetic field $H_{ex}$ is set to 0.

If it is determined in step S35 that there is a boundary of the exchange interaction between the elements, then the value of the coefficient defined for the boundary is set as the coefficient of the exchange interaction from the adjacent element in step S43. For example, if the boundary corresponds to the crystal boundary, the value of the coefficient can be set to a moderate value so that a simulation can be performed using the boundary as a crystal boundary. In step S38, the exchanged magnetic field $H_{ex}$ obtained using the value of the coefficient is used as the exchanged magnetic field of the LLG equation.

The exchange interaction is essentially the interaction between electrons depending on the direction of the spin derived from the Coulomb interaction and the Pauli principle. The smaller the elements, the larger the influence. The exchange interaction has, for example, the effect of uniforming the direction of the micromagnetization vector m among the element groups. If (the coefficient of) the exchange interaction is constant, the change is continuous although the direction of the vector m changes.

Therefore, by reducing the coefficient of the exchange interaction as described above, i.e., by reducing the effect, a simulation can be performed with the crystal boundary between the elements. On the other hand, by increasing the coefficient, the ferromagnetic bond can be expressed. When the coefficient is negative, the inverse magnetic bond can be represented.

If it is determined in step S36 that the exchange interaction is not the same between adjacent element groups, then an average value of interaction coefficients of the element having the number I and the adjacent element is obtained in step S44, and the value is defined as the coefficient of the interaction, thereby obtaining the value of $H_{ex}$ to be added in step S38.

If it is determined in step S40 that the element number I in the element group has reached the maximum value I max, then it is determined in step S45 whether or not the element group number N is smaller than the maximum value N max. If it is smaller than the maximum value, then the value of N is incremented in step S46, and the processes in and after step S32 are repeated. If it is determined in step S45 that the value of N has reached the maximum value, then the time integral of the LLG equation is obtained in step S47, thereby terminating the process.

Finally, the settings of the analysis condition and the element boundary condition for an element are described below by referring to FIGS. 14 and 15. FIG. 14 shows the dialog for setting the analysis condition for an element group.

In FIG. 14, the portions shown directly related to the present invention are mainly described. First, a reference numeral 101 denotes the number of an element group, i.e., an ID. A reference numeral 102 denotes the name of an element group. A reference numeral 103 denotes 3-material selection, and specifies the material of an element group. "No settings" indicates that the element group is not used in a calculation. "Air" specifies the area as air, "conductor" specifies the area as a conductor of a current, "magnetic substance" specifies the area as an area that conducts electricity and treated as a magnetic substance, and "micromagnetization" specifies the flow of a current and the assignment of micromagnetization.

A exciting current 104 indicates an element in which a magnetic field generating current flows. Nonlinearity 105 sets the magnetic characteristic of a magnetic substance as a B-H curve or an M-H curve. Magnetization 106 refers to designation of, for example, the feature of micromagnetization, i.e., its intensity and direction. The designation is done by externally applying a magnetic field in a direction, before a calculation. A reference numeral 107 specifies a micromagnetization calculation only for a group specified by an ID 112 thereby fixing the magnetization for the quasistationary calculation.

A reference numeral 108 denotes the magnetic permeability, a reference numeral 109 denotes a dielectric constant, and a reference numeral 110 denotes the intensity of magnetization in the magnetization 106. A reference numeral 111 denotes each component. A reference numeral 113 corresponds to the number of steps of the intensities of magnetization. A micromagnetization analysis starts at a small value of magnetization intensity. The intensity is gradually increased in the subsequent analyses. When the maximum value is reached, the magnetization intensity is decremented and the micromagnetization analysis is repeated.

A reference numeral 114 denotes a setting area for an important variable in the present analysis. A facility axis magnetic field indicates a magnetic field in the magnetization facility axis direction caused by magnetic anisotropy. An exchange coefficient indicates an exchange interaction coefficient. The magnetization intensity indicates the intensity of micromagnetization. The friction coefficient indicates the value of a friction coefficient in an LLG equation.

A reference numeral 115 denotes a magnetization facility axis direction, and the direction can be either at random or in an unified direction. A reference numeral 116 denotes the direction of an initial magnetization vector as each coordinate axis component, and this setting can be done by magnetization or forcible designation. Reference numerals 117 and 118 are not directly related to the present embodiment, and the explanation is omitted here.

FIG. 15 shows a dialog for setting element boundary conditions. In FIG. 15, a reference numeral 119 is used in specifying a magnetic field calculation boundary, and a reference numeral 120 is used in specifying an exciting current boundary. However, since they are not directly related to the present embodiment, the explanation is omitted here.

A reference numeral 121 is used in setting an exchange interaction. For example, a coefficient depending on an element size can be set for a boundary because the exchange interaction is inversely proportional to the second power of the distance between elements. Instead of the value of a coefficient, a value of an exchanged magnetic field can be directly set. When an exchange interaction is set for an element boundary, the setting is used with a higher priority than the setting for an element group shown in FIG. 14.

Reference numerals 122, 123, and 124 are used in inputting each potential values, i.e., used in inputting each component of vector potential A, scalar potential φ, and magnetic potential φm.

A reference numeral 125 is used in fixing a magnetization vector. For example, by fixing the X direction, only the Y component and the Z component of the micromagnetization vector m are changed. A reference numeral 126 indicates that an exciting current boundary is effective only when the boundary of the ID specified here is invoked.

As described above, various types of analyses can be carried out with higher precision than in the conventional technology using the B-H curve by making various settings, for example, the magnetic field in a facility axis direction, etc.

The micromagnetization analytical program according to the present invention has been described above, the micromagnetization analyzing apparatus for performing the micromagnetization analysis can be applied as a common computer system.

Figure 16:
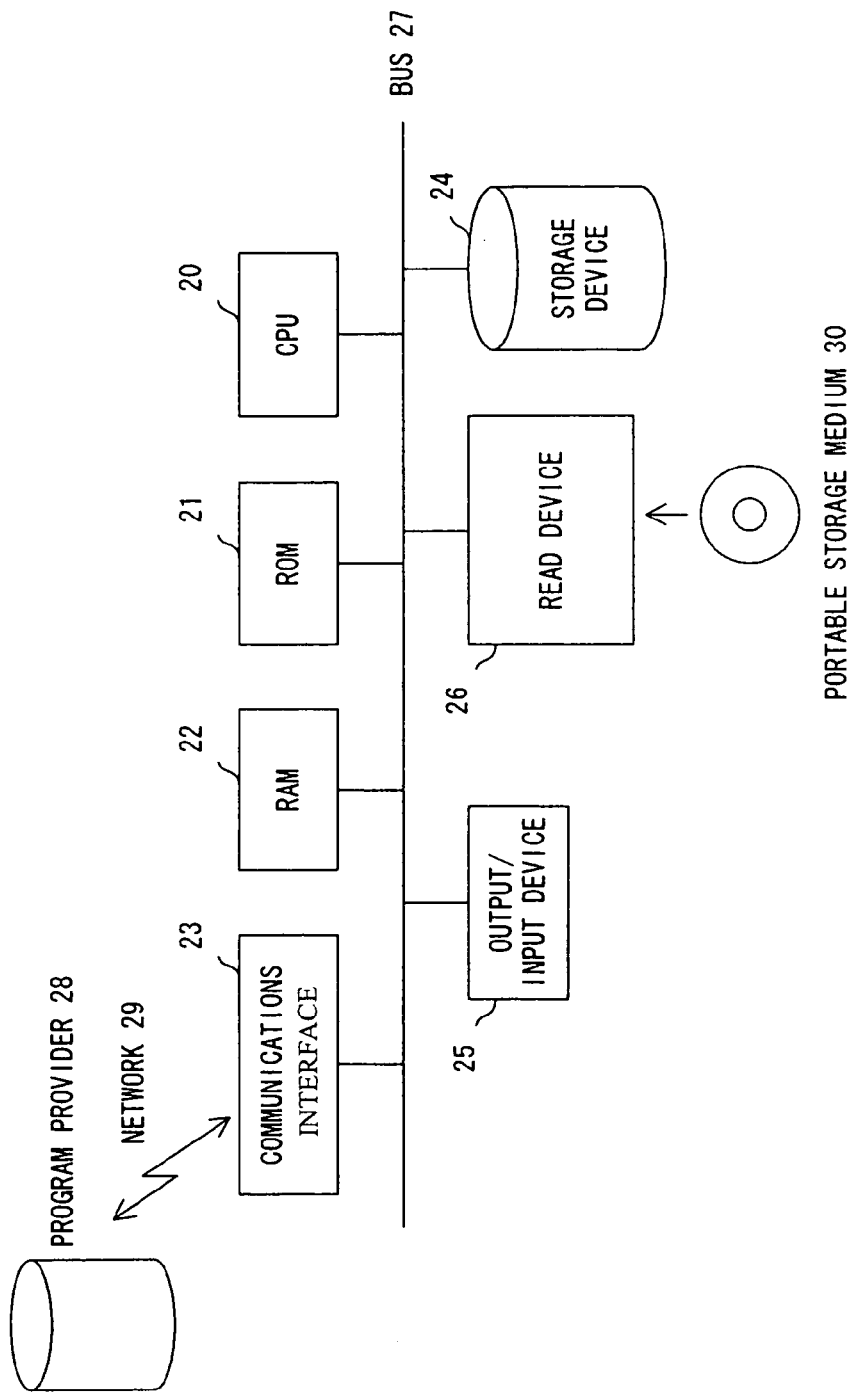
FIG. 16 is a block diagram of a computer system constituting a micromagnetization analyzing apparatus.

FIG. 16 is a block diagram of the configuration of such a computer system, i.e., a hardware environment.

In FIG. 16, the computer system comprises a central processing unit (CPU) 20, read only memory (ROM) 21, random access memory (RAM) 22, a communications interface 23, a storage device 24, an output/input device 25, a read device 26 of a portable storage medium, and a bus 27 for interconnecting these components.

The storage device 24 can be any of various storage devices such as a hard disk, a magnetic disk, etc. The storage device 24 or the ROM 21 storing a program shown in the flowcharts in FIGS. 5, 9 and 11 or a program relating to the present invention, and the CPU 20 executing the program enables an analysis in which micromagnetization is assigned to the center of an element and/or an analysis in which a magnetic field equation and an LLG equation are simultaneously solved.

The program used in the above-mentioned computer can also be stored in, for example, the storage device 24 through a network 29 and the communications interface 23 from a program provider 28, or can be executed by the CPU 20 by being stored in a marketed and distributed portable storage medium 30 and set in the read device 26. The portable storage medium 30 can be any of various storage media such as CD-ROM, a flexible disk, an optical disk, a magneto-optical disk, a DVD, etc.

As described above, according to the present invention, the precision of the micromagnetization analysis can be greatly improved by assigning a parameter of a micromagnetization vector to the center of an element divided in mesh form and simultaneously solving a magnetic field equation and an LLG equation, and by enabling the setting of the magnetic anisotropy, an exchanged magnetic field, a crystal boundary, etc., which cannot be represented by the conventional B-H curve, as various constants by means of a dialog.

Furthermore, the present invention can be applied not only to a manufacturing industry of a magnetic head, but also to all industries requiring a magnetization analysis using a micromagnetization vector.

What is claimed is:

1. A computer-implemented method, comprising
receiving an input of a parameter of a micromagnetization vector assigned to a center of a divided microelement of an area to be analyzed, and a parameter of vector potential assigned to a side or node of the microelement;
generating a magnetic field equation for providing an external magnetic field for micromagnetization using the input parameters, and initializing a time;
obtaining a solution of the magnetic field equation;
obtaining a time integral of Landau Lifshitz Gilbert (LLG) equation using the solution as an external magnetic field for an unstationary LLG equation;
determining whether or not micromagnetization obtained by the time integral satisfies a convergence condition;
correcting the magnetic field equation using the obtained micromagnetization when the convergence condition is not satisfied, and stepwise increasing the time; and
repeating the process of obtaining a solution of the magnetic field equation and subsequent processes.

2. The computer-implemented method according to claim 1, further comprising
obtaining a magnetic field using the micromagnetization obtained by the time integral of the LLG equation when the convergence condition is satisfied.

3. The computer-implemented method according to claim 1, wherein
said magnetic field equation is a stationary magnetic field equation using vector potential.

4. The computer-implemented method according to claim 1, wherein
said magnetic field equation is an unstationary magnetic field equation.

5. The computer-implemented method according to claim 1, wherein
in the process of obtaining the time integral of the LLG equation, a product of a difference between micromagnetization vector assigned to a target element and micromagnetization vector assigned to an adjacent element and an exchange interaction coefficient is set as an exchanged magnetic field by an exchange interaction with the adjacent element.

6. The computer-implemented method according to claim 1, wherein
in the process of obtaining a time integral of the LLG equation, as an exchanged magnetic field for an element contacting a boundary of an element group formed by a plurality of elements, there is set a product of an externally specified one of an exchange interaction coefficient assigned to the boundary and an exchange interaction coefficient assigned to the element group, and a difference between micromagnetization vector assigned to a target element and micromagnetization vector assigned to an adjacent element.

7. A micromagnetization analyzing apparatus, comprising:
- an input unit receiving an input of a parameter of a micromagnetization vector assigned to a center of a divided microelement of an area to be analyzed, and a parameter of vector potential assigned to a side or node of the microelement;
- a magnetic field equation generation unit generating a magnetic field equation for providing an external magnetic field for micromagnetization using the input parameters, and initializing a time;
- a unit obtaining a solution of the magnetic field equation;
- a unit obtaining a time integral of Landau Lifshitz Gilbert (LLG) equation using the solution as an external magnetic field for an unstationary LLG equation;
- a convergence condition determination unit determining whether or not micromagnetization obtained by the time integral satisfies a convergence condition;
- a magnetic field equation correction unit correcting the magnetic field equation using the obtained micromagnetization when the convergence condition is not satisfied, and stepwise increasing the time; and
- a control unit repeating the operation of said unit obtaining a solution of the magnetic field equation and subsequent units using the corrected magnetic field equation.

8. The apparatus according to claim 7, further comprising
a magnetic field calculation unit obtaining a magnetic field by micromagnetization using micromagnetization obtained by the time integral of the LLG equation when the convergence condition is satisfied.

9. A micromagnetization analyzing apparatus, comprising:
- input unit means for receiving an input of a parameter of a micromagnetization vector assigned to a center of a divided microelement of an area to be analyzed, and a parameter of vector potential assigned to a side or node of the microelement;
- magnetic field equation generation means for generating a magnetic field equation for providing an external magnetic field for micromagnetization using the input parameters, and initializing a time;
- means for obtaining a solution of the magnetic field equation;
- means for obtaining a time integral of Landau Lifshitz Gilbert (LLG) equation using the solution as an external magnetic field for an unstationary LLG equation;
- convergence condition determination means for determining whether or not micromagnetization obtained by the time integral satisfies a convergence condition;
- magnetic field equation correction means for correcting the magnetic field equation using the obtained micromagnetization when the convergence condition is not satisfied, and stepwise increasing the time; and
- control means for repeating the operation of said means obtaining a solution of the magnetic field equation and subsequent means using the corrected magnetic field equation.

10. The apparatus according to claim 7, wherein
said magnetic field equation is a stationary magnetic field equation using vector potential.

11. The apparatus according to claim 7, wherein
said magnetic field equation is an unstationary magnetic field equation.

12. The apparatus according to claim 7, wherein
the unit obtaining the time integral of the LLG equation sets a product of a difference between micromagnetization vector assigned to a target element and micromagnetization vector assigned to an adjacent element and an exchange interaction coefficient is set as an exchanged magnetic field by an exchange interaction with the adjacent element.

13. The signal according to claim 7, wherein
the unit obtaining the time integral of the LLG equation sets a product of an externally specified one of an exchange interaction coefficient assigned to a boundary of an element group formed by a plurality of elements and an exchange interaction coefficient assigned to the element group, and a difference between micromagnetization vector assigned to a target element and micromagnetization vector assigned to an adjacent element as an exchanged magnetic field for an element contacting the boundary.

14. The apparatus according to claim 7, wherein
the unit obtaining the time integral of the LLG equation, for an element contacting a boundary of an element group formed by a plurality of elements, sets a value of an exchanged magnetic field by using either an externally received input value of an exchanged magnetic field assigned to the boundary, or an input value of an exchange interaction coefficient which depend on a size of an element and which is multiplied by the different between micromagnetization vector assigned to a target element and micromagnetization vector assigned to an adjacent element to obtain the exchanged magnetic field.

15. A storage medium having stored thereon a set of instructions for implementing a method, said set of instructions comprising at least one instruction for:
- receiving an input of a parameter of a micromagnetization vector assigned to a center of a divided microelement of an area to be analyzed, and a parameter of vector potential assigned to a side or node of the microelement;
- generating a magnetic field equation for providing an external magnetic field for micromagnetization using the input parameters, and initializing a time;
- obtaining a solution of the magnetic field equation;
- obtaining a time integral of Landau Lifshitz Gilbert (LLG) equation using the solution as an external magnetic field for an unstationary Landau Lifshitz Gilbert (LLG) equation;
- determining whether or not micromagnetization obtained by the time integral satisfies a convergence condition;
- correcting the magnetic field equation using the obtained micromagnetization when the convergence condition is not satisfied, and stepwise increasing the time; and
- repeating the process of obtaining a solution of the magnetic field equation and subsequent processes.

16. The storage medium of claim 15, said set of instructions further comprising at least one instruction for:
obtaining a magnetic field using the micromagnetization obtained by the time integral of the Landau Lifshitz Gilbert (LLG) equation when the convergence condition is satisfied.

17. The storage medium of claim 15, wherein
said magnetic field equation is a stationary magnetic field equation using vector potential.

18. The storage medium of claim 15, wherein
said magnetic field equation is an unstationary magnetic field equation.

19. The storage medium of claim 15, wherein
in the process of obtaining the time integral of the Landau Lifshitz Gilbert (LLG) equation, a product of a difference between micromagnetization vector assigned to a target element and micromagnetization vector assigned to an adjacent element and an exchange interaction coefficient is set as an exchanged magnetic field by an exchange interaction with the adjacent element.

20. The storage medium of claim 15, wherein
in the process of obtaining a time integral of the Landau Lifshitz Gilbert (LLG) equation, as an exchanged magnetic field for an element contacting a boundary of an element group formed by a plurality of elements, there is set a product of an externally specified one of an exchange interaction coefficient assigned to the boundary and an exchange interaction coefficient assigned to the element group, and a difference between micromagnetization vector assigned to a target element and micromagnetization vector assigned to an adjacent element.

* * * * *